United States Patent
Johnson

(10) Patent No.: US 9,490,220 B2
(45) Date of Patent: *Nov. 8, 2016

(54) REDISTRIBUTION STRUCTURES FOR MICROFEATURE WORKPIECES

(71) Applicant: Micron Technology, Inc., Boise, ID (US)

(72) Inventor: Mark S. Johnson, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/611,868

(22) Filed: Feb. 2, 2015

(65) Prior Publication Data

US 2015/0145593 A1 May 28, 2015

Related U.S. Application Data

(62) Division of application No. 11/846,460, filed on Aug. 28, 2007, now Pat. No. 8,946,873.

(51) Int. Cl.
*H01L 29/00* (2006.01)
*H01L 23/552* (2006.01)
(Continued)

(52) U.S. Cl.
CPC ....... *H01L 23/552* (2013.01); *H01L 21/76846* (2013.01); *H01L 23/3114* (2013.01); *H01L 23/5225* (2013.01); *H01L 23/5226* (2013.01); *H01L 23/5286* (2013.01); *H01L 2224/05001* (2013.01); *H01L 2224/05008* (2013.01);
(Continued)

(58) Field of Classification Search
CPC .............. H01L 2924/00; H01L 2224/48227; H01L 2224/73265; H01L 2224/73204; H01L 2224/0239; H01L 2924/3025; H01L 23/5225
See application file for complete search history.

(56) References Cited

U.S. PATENT DOCUMENTS 5,345,105 A * 9/1994 Sun ............... H01L 23/5225
257/659
5,406,117 A 4/1995 Dlugokecki et al.
(Continued)

FOREIGN PATENT DOCUMENTS

JP 06224562 8/1994
JP 10284638 10/1998
(Continued)

OTHER PUBLICATIONS

Beyne, E., "Cu Interconnections and Low-K Dielectrics, Challenges for Chip Interconnections and Packaging," abstract only, Proceedings of the IEEE 2003 International Interconnect Technology Conference, Jun. 2003.
(Continued)

*Primary Examiner* — Cuong B Nguyen
(74) *Attorney, Agent, or Firm* — Perkins Coie LLP

(57) ABSTRACT

Microfeature dies with redistribution structures that reduce or eliminate line interference are disclosed. The microfeature dies can include a substrate having a bond site and integrated circuitry electrically connected to the bond site. The microfeature dies can also include and a redistribution structure coupled to the substrate. The redistribution structure can include an external contact site configured to receive an electric coupler, a conductive line that is electrically connected to the external contact site and the bond site, and a conductive shield that at least partially surrounds the conductive line.

15 Claims, 10 Drawing Sheets

(51) Int. Cl.
   *H01L 23/31*      (2006.01)
   *H01L 23/522*     (2006.01)
   *H01L 21/768*     (2006.01)
   *H01L 23/528*     (2006.01)

(52) U.S. Cl.
   CPC ............... *H01L2224/05024* (2013.01); *H01L 2224/05026* (2013.01); *H01L 2224/05124* (2013.01); *H01L 2224/05144* (2013.01); *H01L 2224/05147* (2013.01); *H01L 2224/05169* (2013.01); *H01L 2224/16* (2013.01); *H01L 2924/00014* (2013.01); *H01L 2924/01019* (2013.01); *H01L 2924/01078* (2013.01); *H01L 2924/01079* (2013.01); *H01L 2924/3011* (2013.01); *H01L 2924/3025* (2013.01)

(56) References Cited

U.S. PATENT DOCUMENTS

| | | | |
|---|---|---|---|
| 6,057,600 A * | 5/2000 | Kitazawa | H01L 23/66 257/691 |
| 6,133,621 A | 10/2000 | Gaibotti et al. | |
| 6,331,736 B1 | 12/2001 | Duesman et al. | |
| 6,353,540 B1 | 3/2002 | Akiba et al. | |
| 6,388,198 B1 * | 5/2002 | Bertin | H01L 21/76898 174/251 |
| 6,573,597 B2 | 6/2003 | Dove et al. | |
| 6,674,174 B2 | 1/2004 | Chungpaiboonpatana et al. | |
| 7,253,516 B2 | 8/2007 | Coenen et al. | |
| 2004/0212099 A1 | 10/2004 | Klein et al. | |
| 2005/0121771 A1 | 6/2005 | Lin et al. | |
| 2005/0275085 A1 | 12/2005 | Brintzinger et al. | |
| 2006/0067624 A1 | 3/2006 | Towle et al. | |
| 2006/0103020 A1 | 5/2006 | Tong et al. | |
| 2006/0220261 A1 | 10/2006 | Egawa | |
| 2006/0267216 A1 | 11/2006 | Li et al. | |
| 2006/0289994 A1 | 12/2006 | Greenberg et al. | |
| 2006/0291029 A1 | 12/2006 | Lin et al. | |
| 2007/0013069 A1 | 1/2007 | Tada et al. | |
| 2007/0045872 A1 | 3/2007 | Fee | |
| 2008/0012097 A1 | 1/2008 | Takahashi et al. | |
| 2009/0057848 A1 | 3/2009 | Johnson | |

FOREIGN PATENT DOCUMENTS

| | | |
|---|---|---|
| JP | 2002313930 | 10/2002 |
| JP | 2004266117 | 9/2004 |
| JP | 2007134359 | 5/2007 |
| JP | 05206320 | 6/2013 |
| KR | 20070037826 | 4/2007 |

OTHER PUBLICATIONS

Chinese Office Action mailed Dec. 31, 2010 in Chinese Patent Application No. 200880103869.1, filed Aug. 5, 2008, 11 pages.

European Examination Report mailed Mar. 17, 2011 in European Application No. 08797212.1 filed Aug. 5, 2008, 7 pages.

Goodman, T. et al. "Post-Passivation Layers: Device Enhancement at the Wafer Level," Conference Proceedings, 2004 Pan Pacific Symposium, Feb. 10, 2004, <http://www.smta.org/files/pan_pac04-goodman.pdf>.

International Search Report and Written Opinion issued Mar. 26, 2009 in International Application No. PCT/US2008/072242.

Japanese Office Action mailed Dec. 18, 2013 in Japanese Patent Application No. 2010-523016, filed Aug. 5, 2008, 5 pages.

Japanese Office Action mailed Sep. 6, 2011 in Japanese Patent Application No. 2010-523016, filed Aug. 5, 2008, 8 pages.

Korean Final Office Action mailed May 18, 2012 in Korean Patent Application 10-2010-7004892, filed Aug. 5, 2008, 2 pages.

Korean Office Action mailed Aug. 30, 2011 in Korean Patent Application No. 10-2010-7004892, filed Aug. 5, 2008, 7 pages.

Scanlan, C.M. et al., "System-In-Package Technology, Application and Trends," Conference Proceedings, 2001 SMTA International, Sep. 30, 2001, <http://www.smta.org/files/SMTA101-Scanlan.pdf>.

Sung, M. et al., "Microwave Frequency Crosstalk Model of Redistribution Line Patterns on Wafer Level Package," abstract only, IEEE Transactions on Advanced Packaging, May 2002, vol. 25, Issue 2.

Wu, Z. et al, "Flip-Chip Redistribution Layer Electrical Characterization and SSO Noise Simulation," abstract only, IEEE 6th Topical Meeting on Electrical Performance of Electronic Packaging, Oct. 1997.

* cited by examiner

REDISTRIBUTION STRUCTURES FOR MICROFEATURE WORKPIECES

CROSS-REFERENCE TO RELATED APPLICATIONS

This application is a divisional of U.S. patent application Ser. No. 11/846,460 filed Aug. 28, 2007, now U.S. Pat. No. 8,946,873, which is incorporated herein by reference.

TECHNICAL FIELD

The present disclosure is directed to redistribution structures that reduce or eliminate line interference for microfeature workpieces, associated systems with such redistribution structures, and methods for making redistribution structures.

BACKGROUND

Microelectronic devices generally have dies with an array of very small bond sites electrically coupled to integrated circuitry formed within the dies. The bond sites provide external electrical contacts for transmitting power, input/output signals, ground, and/or other electrical signals to/from the integrated circuitry. Different types of dies may have different bond-site arrangements, and yet the different dies should be compatible with similar external devices. Existing packaging techniques include forming a redistribution structure (RDS) on the dies. The RDS can include lines and/or vias that connect the die bond sites with RDS bond sites arranged to mate with external devices.

Existing RDS configurations, however, have lines and/or vias that can limit the performance of the microelectronic devices. For example, the microelectronic devices may not operate at high clock speeds because signals transmitted at high frequencies via the lines and/or vias can be leaked, distorted, or otherwise affected due to electrical and/or magnetic interference. Accordingly, existing RDS configurations may not work well with high performance microelectronic devices.

DETAILED DESCRIPTION

Figure 1A:
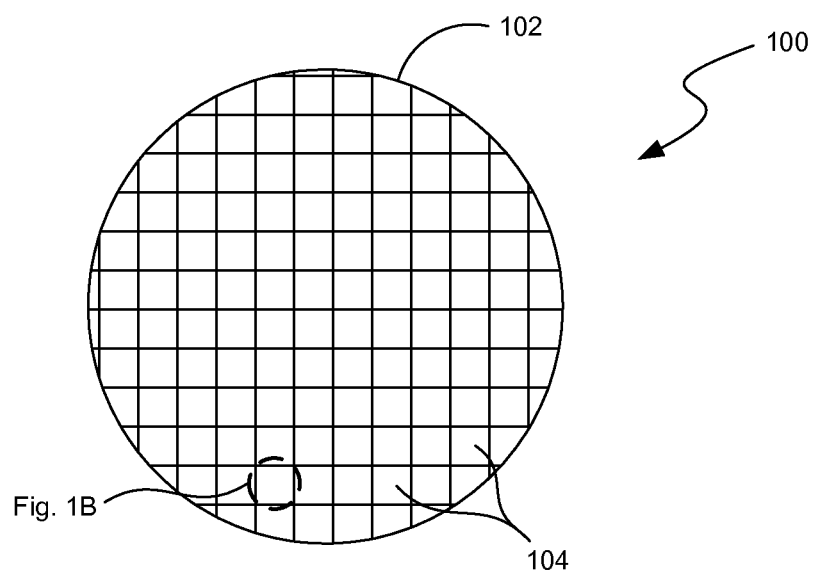
FIG. 1A is a partially schematic top view of a semiconductor workpiece including a plurality of microfeature dies in accordance with embodiments of the disclosure.

FIG. 1A is a semiconductor workpiece 100 having a substrate 102 and a plurality of microfeature dies 104 arranged on and/or in the substrate 102. Several processes described below may be conducted on the semiconductor workpiece 100 at the wafer level and/or on the individual microfeature dies 104 of the semiconductor workpiece 100 after the dies 104 have been singulated from the larger wafer 102. Accordingly, unless otherwise noted, structures and methods described below in the context of a "microfeature workpiece" can apply to the wafer 102 and/or the dies 104 that are formed from the wafer 102.

Although several embodiments are described in connection with a semiconductor workpiece or wafer, other embodiments may have other types of workpieces. As such, the terms "microfeature workpiece" and "workpiece" refer to substrates in and/or on which microelectronic devices are integrally formed. Typical microelectronic devices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. Substrates can be semiconductor pieces (e.g., doped silicon wafers or gallium arsenide wafers), nonconductive pieces (e.g., various ceramic substrates), or conductive pieces. In some cases, the workpieces are generally round, and in other cases, the workpieces have other shapes, including rectilinear shapes.

Figure 1B:
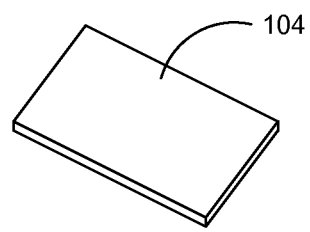
FIG. 1B is a schematic perspective view of a microfeature die singulated from the workpiece shown in FIG. 1A.

FIG. 1B is a schematic perspective view of an individual die 104 after it has been singulated from the wafer 102 shown in FIG. 1A. The die 104 can include operable microelectronic structures, such as integrated circuitry, and the die 104 can be optionally encased within a protective encapsulant. The die 104 can also have pins, bond sites, solder balls, and/or other conductive structures to electrical couple structures within the die 104 to structures/devices located external to the die.

Figure 2A:
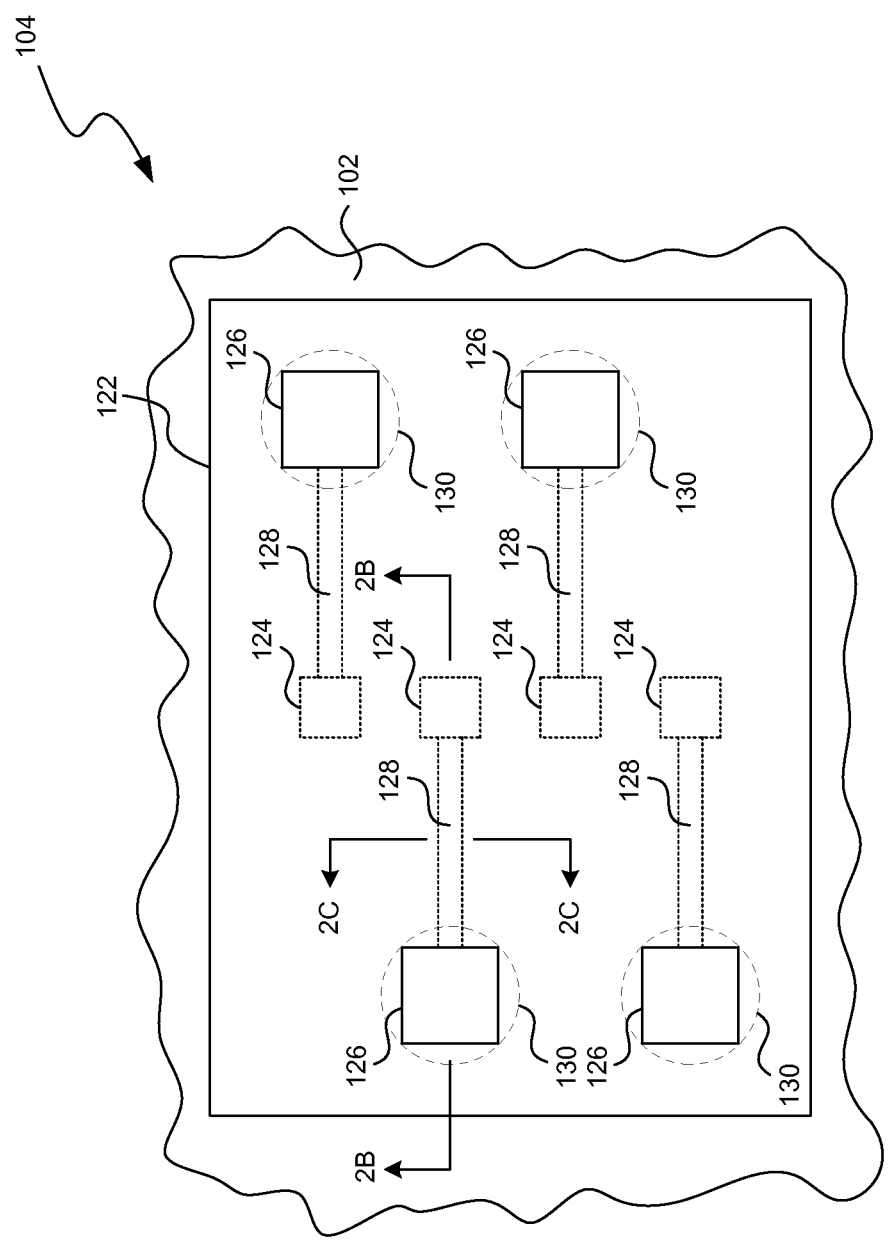
FIG. 2A is a partially schematic, top view of a portion of a die with a redistribution structure in accordance with an embodiment of the disclosure.
Figure 2B:
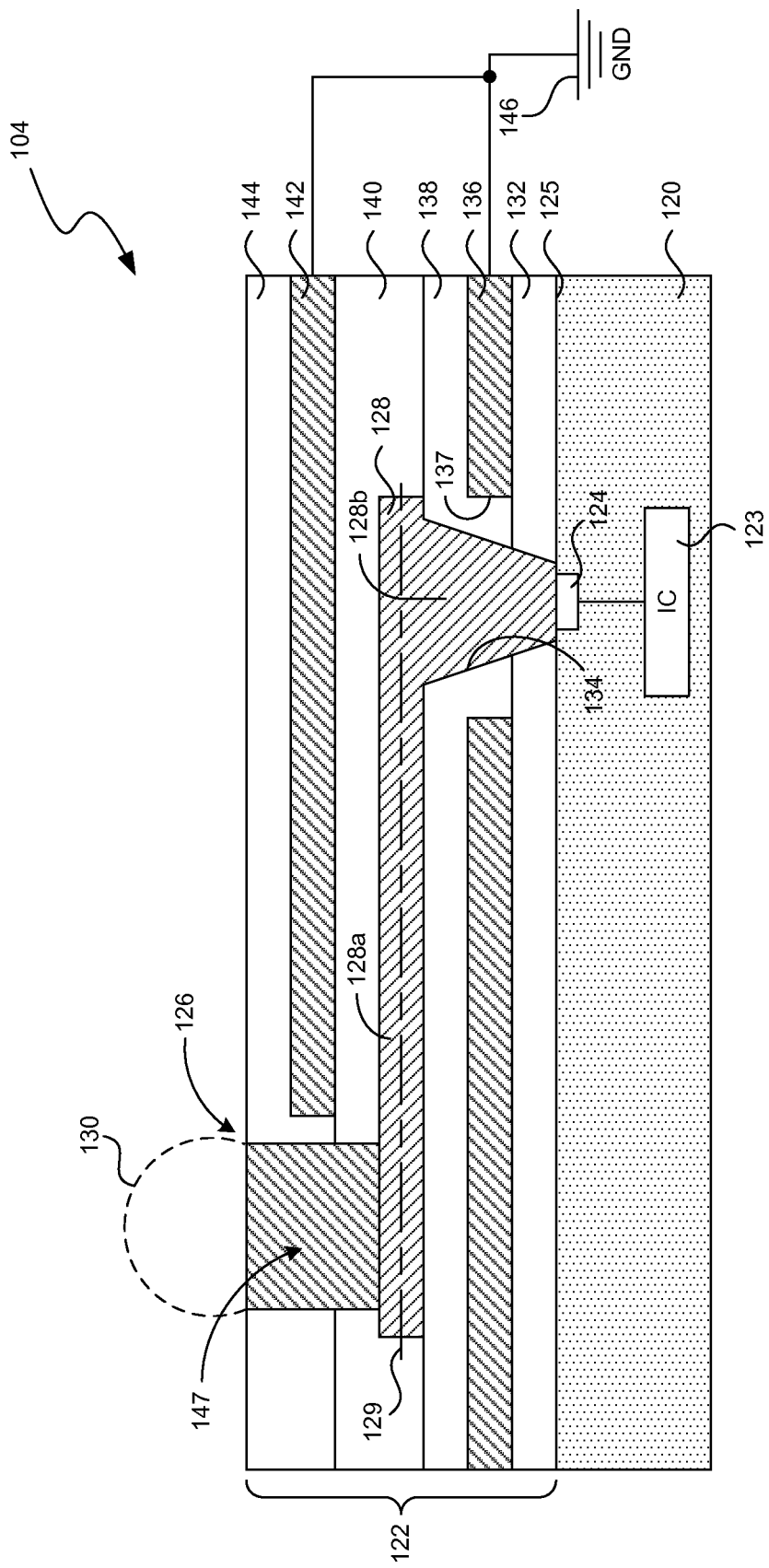
FIGS. 2B-C are partially schematic, cross-sectional views of a portion of the die shown in FIG. 2A in accordance with an embodiment of the disclosure.
Figure 2C:
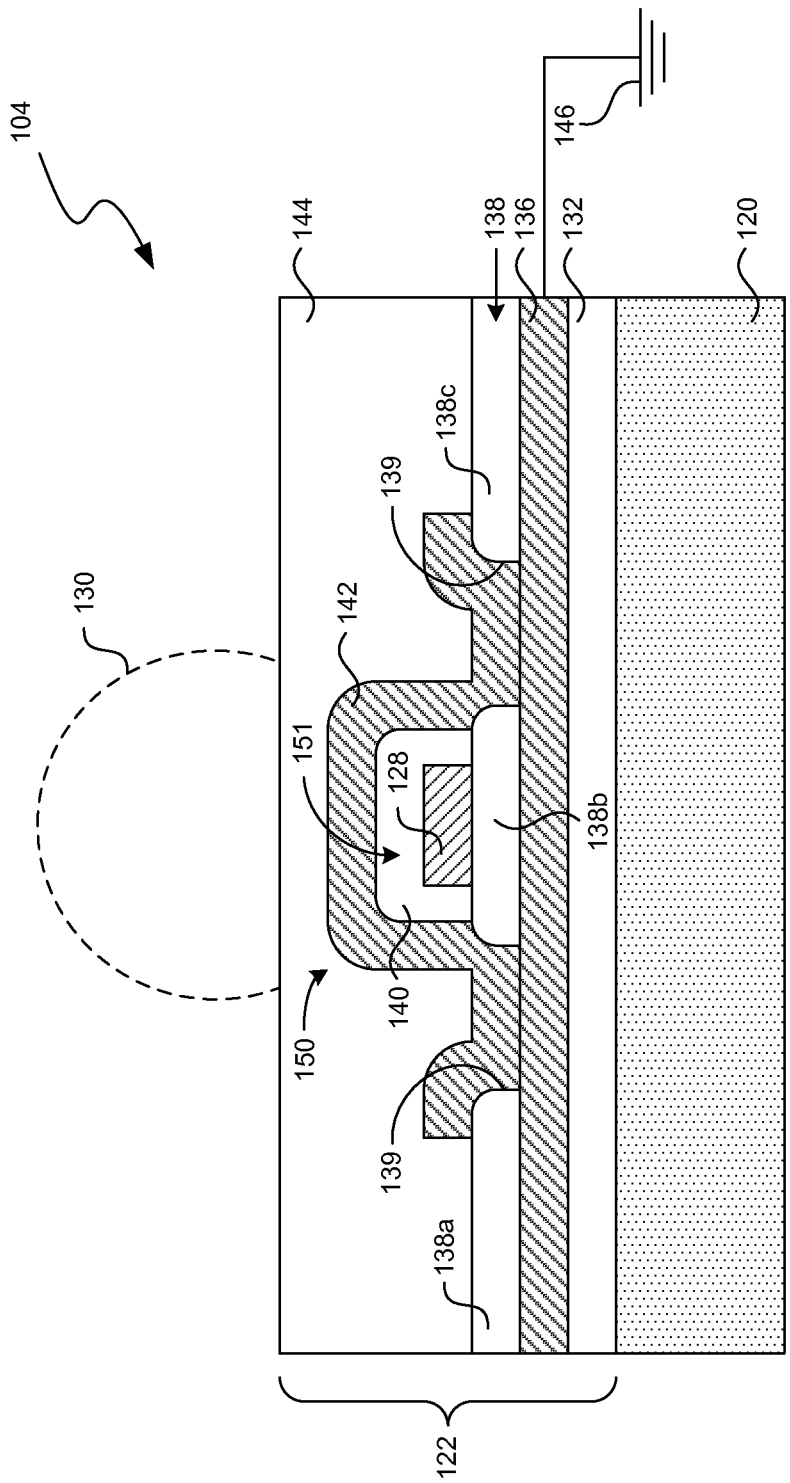

FIGS. 2A-2C illustrate several embodiments of the die 104 having a redistribution structure (RDS) that can reduce or eliminate interference. In particular embodiments, the RDS can include lines and/or vias that are at least partially shielded from external electrical and/or magnetic interference. A person skilled in the relevant art will understand, however, that the disclosure may have additional embodiments, and that the disclosure may be practiced without several of the details of the embodiments described below with reference to FIGS. 2-4.

FIG. 2A is a partially schematic, top view of a portion of the substrate 102 and one of the dies 104 in accordance with an embodiment of the disclosure. As shown in FIG. 2A, the die 104 can include a plurality of bond sites 124 electrically connected to integrated circuitry in the substrate 102 and a redistribution structure 122 disposed on the substrate 120. The redistribution structure 122 can include a plurality of external contact sites 126 and conductive lines 128. The external contact sites 126 can be configured to receive an electrical coupler 130 (e.g., a solder ball, shown in phantom lines for clarity) for connecting the die 104 to external devices (not shown). The conductive lines 128 can be metal traces that individually connect one of the bond sites 124 to one of the external contact sites 126. The conductive lines 128 can be generally in close proximity to one another.

FIG. 2B is a partially schematic, cross-sectional view of a portion of the die 104 along a transmission length 129 of the conductive line 128 shown in FIG. 2A in accordance with an embodiment of the disclosure. As shown in FIG. 2B, the substrate 102 can include integrated circuitry 123 (shown schematically) electrically connected to the bond site 124. In the illustrated embodiment, the bond site 124 is generally flush with a surface 125 of the substrate 120. In other embodiments, the bond site 124 can be at least partially recessed into the surface 125 or project away from the surface 125.

The redistribution structure 122 can include a first dielectric layer 132 disposed on the surface 125 of the substrate 120, a first metal layer 136 disposed on the first dielectric layer 132, and a second dielectric layer 138 disposed on the first metal layer 136. The first metal layer 136 has an opening 137 generally aligned with the bond site 124, and a portion of the second dielectric layer 138 is in the opening 137. The first and second dielectric layers 132, 138 have an opening 134 generally aligned with the opening 137 in the first metal layer 136 and extending to the bond site 124. The portion of the second dielectric layer 138 in the opening 137 electrically insulates the first metal layer 136 from the opening 134.

In this embodiment, the conductive line 128 includes a first portion 128a that extends along the second dielectric layer 138 and a second portion 128b in the first opening 134. The second portion 128b of the conductive line 128 electrically couples the first portion 128a of the conductive line 128 to the bond site 124 of the die 104.

The redistribution structure 122 can further include a third dielectric layer 140 disposed on the conductive line 128 and the second dielectric layer 138, a second metal layer 142 disposed on the third dielectric layer 140, and a fourth dielectric layer 144 disposed on the second metal layer 142 and the third dielectric layer 140. The third and fourth dielectric layers 140, 144 have an opening 147 generally aligned with a section of the first portion 128a of the conductive line 128. The opening 147 can be filled with a conductive material to form the external contact site 126 for receiving the electrical coupler 130. The fourth dielectric layer 144 electrically insulates the second metal layer 142 from the external contact site 126. The first and second metal layers 136, 142 can be electrically connected to ground 146, as described in more detail below with reference to FIG. 2C.

In various embodiments of the redistribution structure 122, individual dielectric layers 132, 138, 140, and 144 can include silicon oxide, silicon nitride, a polymer dielectric material, and/or other suitable dielectric material. Individual metal layers 136, 142, the external contact site 126, and/or the conductive line 128 can include copper, aluminum, gold, platinum, and/or other suitable conductive material.

FIG. 2C is another partially schematic, cross-sectional view of a portion of the microfeature die 104 along a plane generally normal to the transmission length 129 of the conductive line 128 shown in FIG. 2A. As showing in FIG. 2C, the second dielectric layer 138 can also include one or more connection openings 139 that separate the second dielectric layer 138 into first, second, and third sections 138a-c. The second section 138b carries the conductive line 128 and cooperates with the third dielectric layer 140 to form a separation layer 151 that substantially surrounds the conductive line 128 along a circumference of the conductive line 128.

The second metal layer 142 can surround the third dielectric layer 140 and at least a portion of the second section 138b. The second metal layer 142 can also extend into the connection openings 139 to contact the first metal layer 136. As a result, the first and second metal layers 136, 142 can be electrically coupled to form a conductive shield 150 around the conductive line 128 along at least a portion of the transmission length 129. The conductive shield 150 can be connected to the ground 146 via a connection via, a trace, and/or other suitable connection mechanisms. The conductive shield 150 and the separation layer 151 can extend generally coaxially along at least a portion of the transmission length 129 of the conductive line 128.

In operation, the conductive shield 150 can reduce emitted electromagnetic, electrical, and/or magnetic energy from signals carried on the conductive line 128. With conventional techniques, electrical signals in microelectronic devices are typically transmitted via unshielded conductive lines separated from one another with a dielectric material. Such unshielded conductive lines can be conductively coupled, capacitively coupled, inductively coupled, and/or otherwise electromagnetically interactive with one another. Thus, when a signal is transmitted via one of the lines, the electrical coupling can generate echoes, attenuation, and/or other interference to the transmitted signal and/or to other signals carried by neighboring lines. Further, external electrical-magnetic interference (EFI), e.g., from nearby operating machinery, can also affect the transmitted signals on the conductive lines.

The embodiment of the die 104 shown in FIGS. 2A-2C mitigates or eliminates interference by forming the grounded conductive shield 150 along at least a portion of the transmission length 129 of the conductive line 128. The grounded shield 150 confines signals transmitted via the conductive line 128 to the area between the first and second metal layers 136, 142. More specifically, currents induced in areas beyond the grounded shield 150 by the transmitted signals can be reduced or eliminated because the conductive shield 150 can conduct the induced currents to the ground 146. As a result, the signals carried on the conductive line 128 can operate at high frequencies for enhanced performance.

The conductive shield 150 can also allow the conductive lines 128 to be positioned close to one another. Electromagnetic coupling between two adjacent unshielded conductive lines may be more profound as the distance between the two conductive lines decreases. As a result, such electromagnetic coupling can limit the "pitch" between each pair of the conductive lines. The embodiment of the conductive lines 128 shown in FIGS. 2A-2C, however, can be positioned with a small pitch because individual conductive lines 128 are shielded and protected from interfering with one another.

The conductive shield 150 can also enable a designer to select a desired impedance for the conductive line 128. According to conventional techniques, the impedance of an unshielded conductive line is typically a function of, at least in part, the frequencies of signals carried on the conductive line. As a result, predicting and accommodating the impedance of the conductive line can be difficult. Several embodiments of the conductive line 128 though can have an impedance that is not dependent on the frequencies of signals. Instead, the impedance of the conductive line 128 is, at least in part, a function of the relative dielectric constant of the second and third dielectric layers 138, 140 and the geometry of the conductive line 128, the first metal layer 136, and/or the second metal layer 142.

The conductive shield 150 can further enable a designer to adequately accommodate a desired cutoff frequency for the conductive line 128 in order to reduce transmission noise. A cutoff frequency refers generally to a frequency above which the power output from the conductive line 128 is about one half of the power of the passband. When an operating frequency is below the cutoff frequency, the signals carried on the conductive line 128 can travel as waves in the transverse electromagnetic mode. Above the cutoff frequency, the signals can also travel in the transverse electric and/or transverse magnetic modes. The multiple modes can cause different phase velocities to propagate along the conductive line 128 in a manner that causes interference. The cutoff frequency can be influenced by the geometry of the conductive line 128 when the conductive line 128 is protected with a grounded shield. Accordingly, the designer can adequately accommodate the desired cutoff frequency by selecting a suitable geometry for the conductive line 128.

Even though the second dielectric layer 138 is shown in FIG. 2C to include two connection openings 139, in certain embodiments, the second dielectric layer 138 can include one or more than two connection openings 139. Moreover, although the conductive line 128 is shown in FIG. 2C to have a generally rectangular cross section, in other embodiments, the conductive line 128 can have a circular, an oval, and/or other cross section.

Figure 3A:
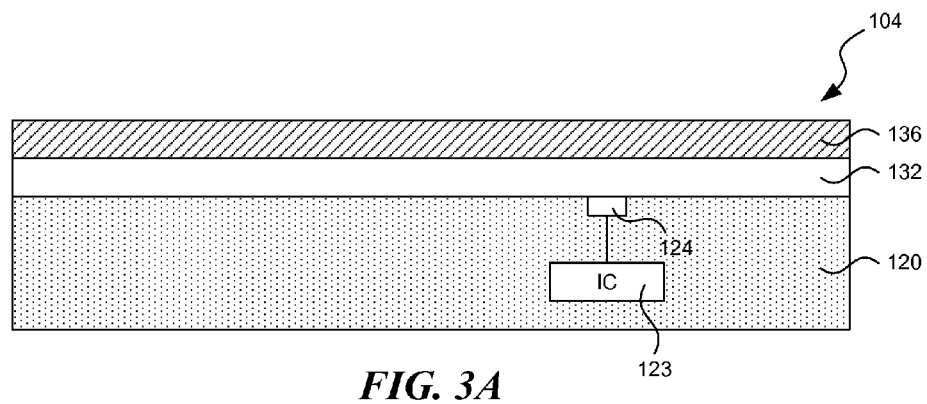
FIGS. 3A-3K illustrate a process for forming the redistribution structure shown in FIGS. 2A-C in accordance with an embodiment of the disclosure.
Figure 3B:
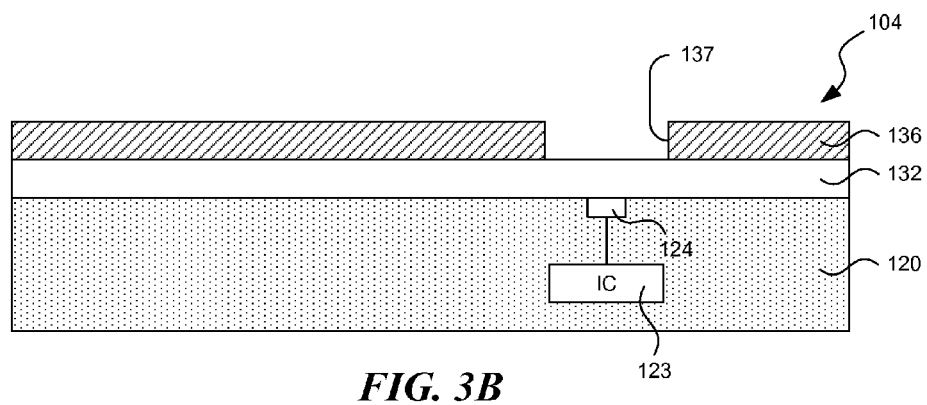

FIGS. 3A-K illustrate stages of an embodiment of a process for forming the redistribution structure 122 on the substrate 120. FIG. 3A illustrates an early stage of the process, which includes depositing the first dielectric layer 132 on the substrate 120 and depositing the first metal layer 136 on the first dielectric layer 132. FIG. 3B illustrates a subsequent stage of the process, which includes etching back the first metal layer 136 to expose a portion of the first dielectric layer 132. The exposed portion of the first dielectric layer 132 generally corresponds to the bond site 124.

Figure 3C:
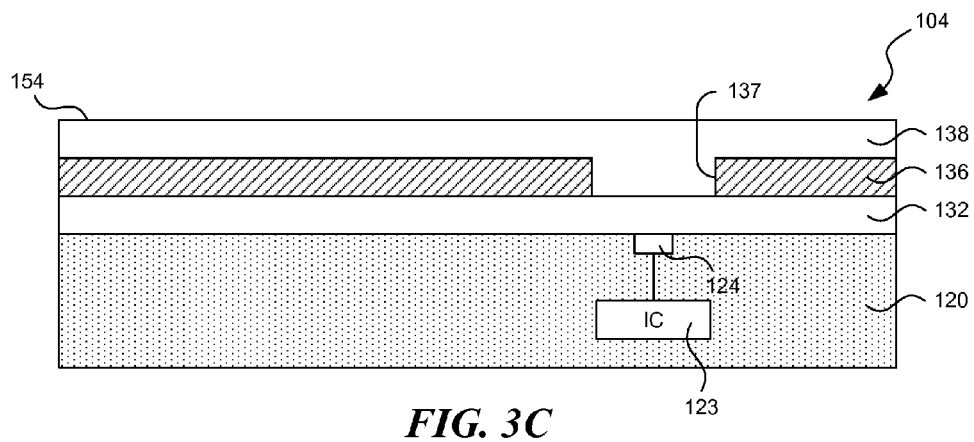

FIG. 3C illustrates another stage, which includes depositing the second dielectric layer 138 on the first metal layer 136 and the exposed portion of the first dielectric layer 132. The second dielectric layer 138 can also be polished (e.g., using chemical mechanical polishing) and/or otherwise processed to have a generally planar top surface 154.

Figure 3D:
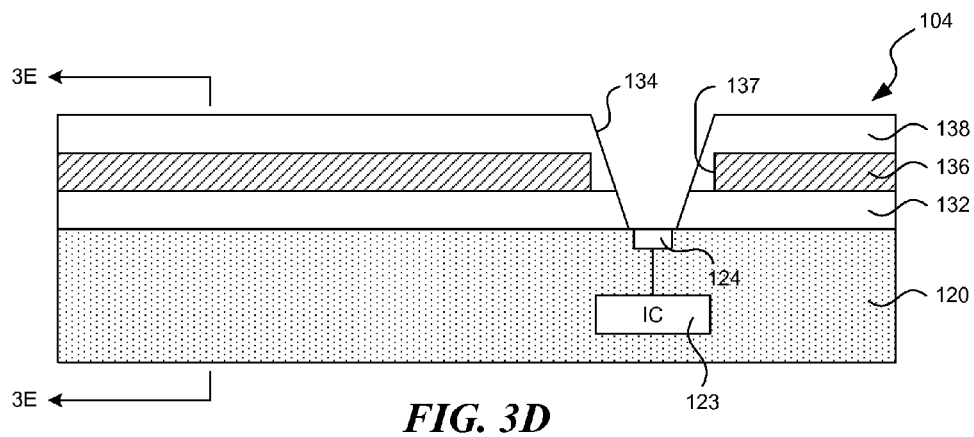
Figure 3E:
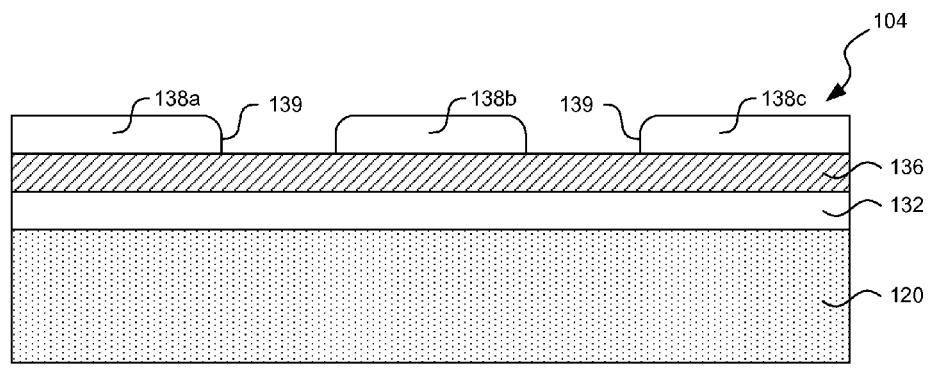

As illustrated in FIG. 3D, the first and second dielectric layers 132, 138 can then be etched (e.g., using a plasma enhanced etching) to form the first opening 134 and to expose the bond site 124. As shown in FIG. 3E, the process can also include etching the second dielectric layer 138 to form the connection openings 139 that separate the second dielectric layer 138 into the first, second, and third sections 138a-c. In one embodiment, the first opening 134 and the connection openings 139 are formed in separate etching stages. In other embodiments, the first opening 134 and the connection openings 139 can be formed in a single etching stage.

Figure 3F:
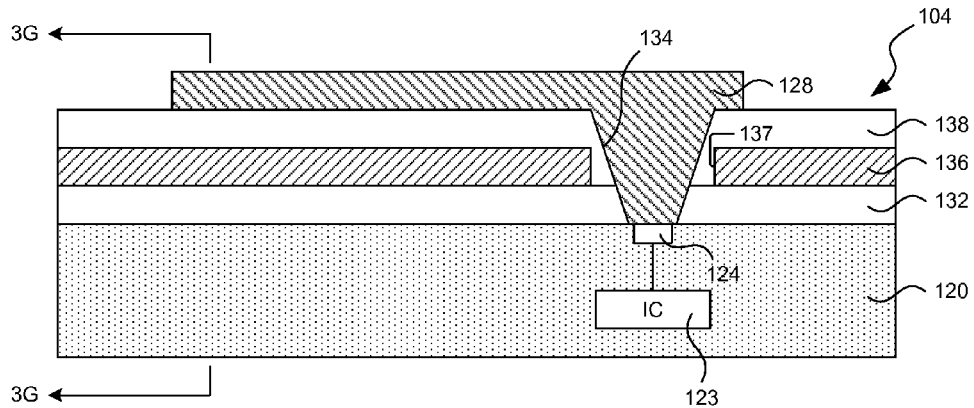
Figure 3G:
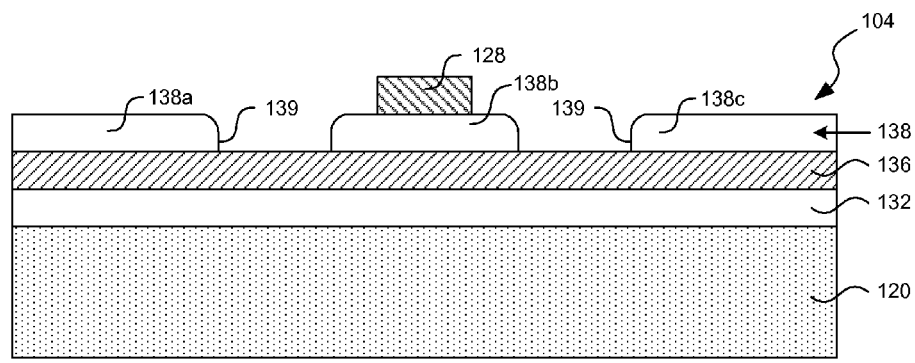

The process can also include depositing the conductive line 128 on the second dielectric layer 138 and in the first opening 134, as illustrated in FIG. 3F. As illustrated in FIG. 3G, the conductive line 128 does not cover the entire area of the second dielectric layer 138. Instead, the conductive line 128 can be deposited on the second section 138b of the second dielectric layer 138. In one embodiment, the conductive line 128 can be formed by depositing a seed layer (not shown) and then plating a conductive material (e.g., copper, aluminum, and gold) onto the seed layer. In other embodiments, the conductive line 128 can be formed by chemical vapor deposition, atomic layer deposition, and/or other suitable techniques.

Figure 3H:
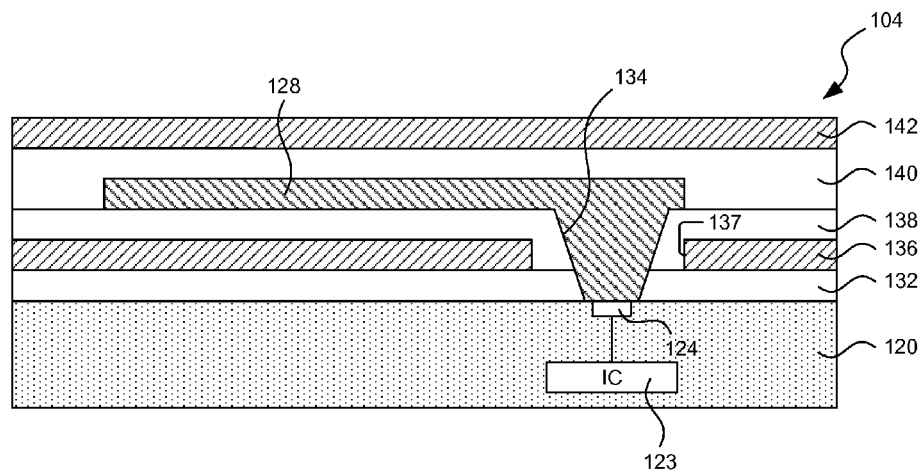
Figure 3I:
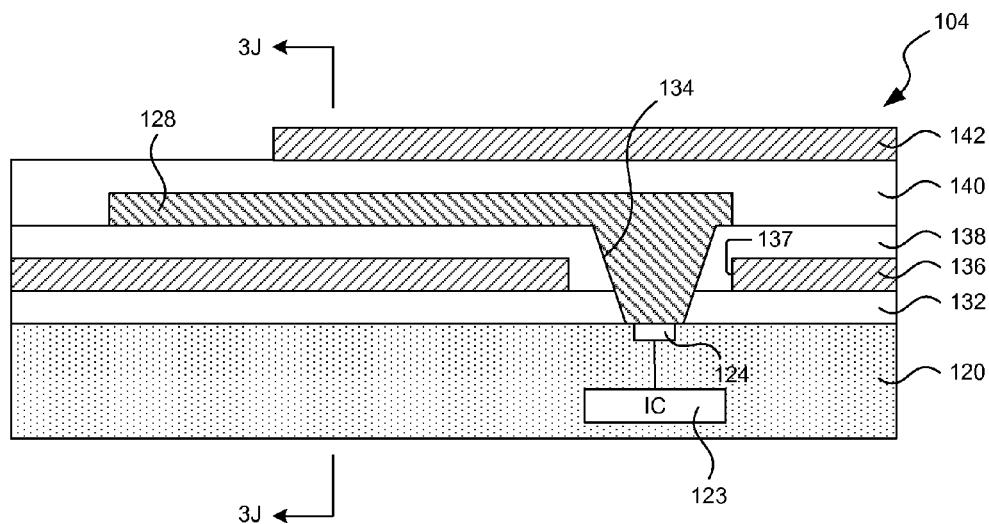

FIG. 3H shows a stage of the process, which includes depositing the third dielectric layer 140 on the conductive line 128 and depositing the second metal layer 142 on the third dielectric layer 140. The second metal layer 142 can then be etched back to expose a portion of the third dielectric layer 140, as illustrated in FIG. 3I.

Figure 3J:
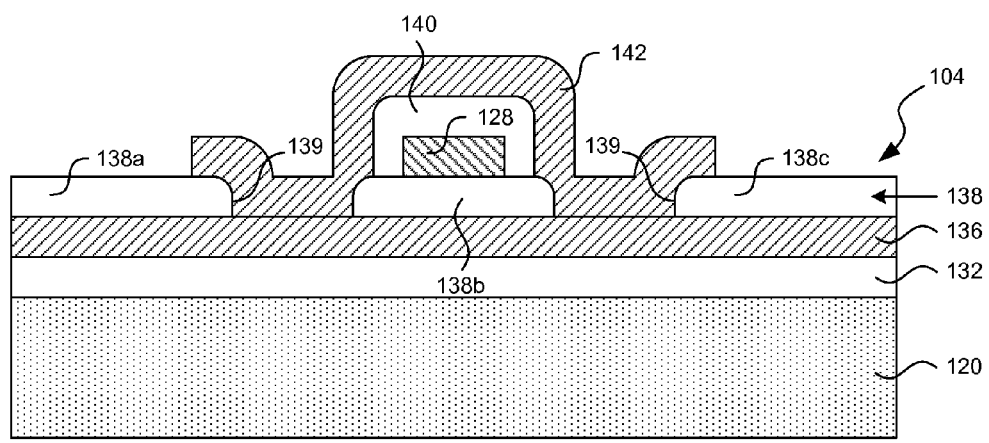

Referring to FIG. 3J, the second metal layer 142 can be deposited to substantially surround the third dielectric layer 140 and at least a portion of the second section 138b of the second dielectric layer 138 such that the second and third dielectric layers 138, 140 electrically insulate the conductive line 128 from the first and second metal layers 136, 142. The second metal layer 142 can also be deposited in the connection openings 139 such that at least a portion of the second metal layer 142 is in physical and electrical contact with the first metal layer 136.

Figure 3K:
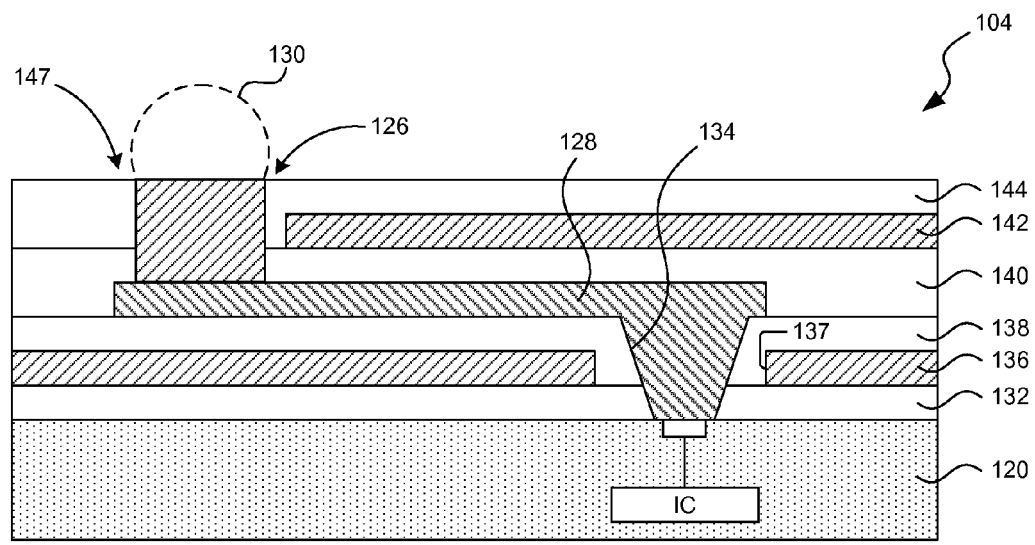

FIG. 3K illustrates a stage of the process, which includes depositing the fourth dielectric layer 144 on the die 104 and etching the third and fourth dielectric layers 140, 144 to form the second opening 147. At least a portion of the conductive line 128 is exposed in the second opening 147. The second opening 147 can then be filled with a conductive material to form the external contact site 126.

The process described above with reference to FIGS. 3A-3K can have additional and/or different process stages. For example, barrier layers can be deposited before depositing at least one of the metal layers. Etch-stop or polish-stop layers can also be used when removing a portion of any deposited material.

Figure 4:
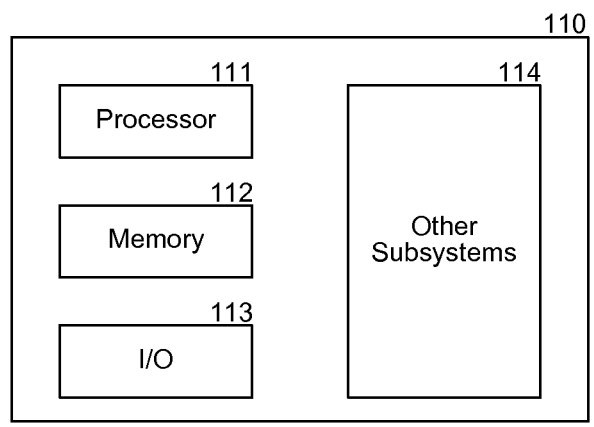
FIG. 4 is a schematic diagram of a system that can include one or more microfeature dies in accordance with embodiments of the disclosure.

Individual dies 104 may be incorporated into any of a myriad of larger and/or more complex systems 110, a representative one of which is shown schematically in FIG. 4. The system 110 can include a processor 111, a memory 112, input/output devices 113, and/or other subsystems or components 114. Microfeature workpieces (e.g., in the form of microfeature dies and/or combinations of microfeature dies) may be included in any of the components shown in FIG. 4. The resulting system 110 can perform any of a wide variety of computing, processing, storage, sensor, and/or other functions. Accordingly, representative system 110 can include, without limitation, computers and/or other data processors, for example, desktop computers, laptop computers, Internet appliances, and hand-held devices (e.g., palm-top computers, wearable computers, cellular or mobile phones, multi-processor systems, processor-based or programmable consumer electronics, network computers, mini computers). Another representative system 110 can include cameras, light sensors, servers and associated server subsystems, display devices, and/or memory devices. Components of the system 110 may be housed in a single unit or distributed over multiple, interconnected units, e.g., through a communications network. Components can accordingly include local and/or remote memory storage devices and any of a wide variety of computer-readable media, including magnetic or optically readable or removable computer disks.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A method for forming a redistribution structure on a microfeature die, comprising:
   forming a conductive line over a microfeature die with integrated circuitry, wherein the conductive line electrically connects a bond site of the microfeature die to an external contact site; and
   forming a conductive shield at least partially enclosing at least a portion of a length of the conductive line, wherein forming the conductive shield includes forming an opening in the conductive shield via etching, and wherein the opening extends through a portion of the conductive shield;
   wherein the conductive line is at least the partially formed via deposition of a conductive material that extends through the opening and through at least a portion of a length of the conductive shield; and wherein the conductive shield is electrically grounded.

2. The method of claim 1, further comprising electrically insulating the conductive line from the conductive shield.

3. The method of claim 1, further comprising electrically insulating the external contact site and the bond site from the conductive shield.

4. The method of claim 3, further comprising forming a separation layer between the conductive line and the conductive shield.

5. A method for forming a redistribution structure on a microfeature die, comprising:
- forming a conductive line, wherein the conductive line electrically connects a bond site of the microfeature die to an external contact site, and wherein forming a conductive line includes
  - depositing a first dielectric layer on a substrate of the microfeature die;
  - depositing a first metal layer on the first dielectric layer;
  - etching back the first metal layer to expose a portion of the first dielectric layer;
  - depositing a second dielectric layer on the first metal layer and the exposed portion of the first dielectric layer; and
  - forming a first opening in the first and second dielectric layers to expose the bond site;
  - depositing a conductive material on the second dielectric layer and in the first opening to form the conductive line; and
- forming a conductive shield at least partially enclosing at least a portion of a length of the conductive line, wherein the conductive shield is electrically grounded, and wherein forming the conductive shield includes
  - depositing a third dielectric layer on the conductive line and a second metal layer on the third dielectric layer;
  - etching the second metal layer to expose a portion of the third dielectric layer;
  - depositing a fourth dielectric layer on the second metal layer and the exposed portion of third dielectric layer;
  - forming a second opening in the third and fourth dielectric layers to expose a portion of the conductive line; and
  - filling the second opening with a conductive material to form the external contact site.

6. A method for forming at least one redistribution structure on a microfeature die, the method comprising:
- forming a first dielectric layer on a substrate having a bond site;
- forming a first metal layer on the first dielectric layer;
- forming an opening in the first metal layer, wherein the opening in the first metal layer exposes a portion of the first dielectric layer, and wherein the exposed portion of the first dielectric layer is adjacent to the bond site;
- forming a second dielectric layer on the first metal layer and on the exposed portion of the first dielectric layer;
- removing a first portion of the second dielectric layer to form a first connection opening exposing a first portion of the first metal layer;
- removing a second portion of the second dielectric layer to form a second connection opening exposing a second portion of the first metal layer, wherein the first connection opening extends parallel to the second connection opening with a section of the second dielectric layer positioned therebetween;
- forming an opening extending through the first dielectric layer and the second dielectric layer, wherein the opening extending through the first dielectric layer and the second dielectric layer exposes the bond site;
- forming a conductive line that extends along the section of the second dielectric layer and into the opening extending through the first dielectric layer and the second dielectric layer, wherein the conductive line and the bond site are electrically coupled;
- forming a third dielectric layer on the conductive line, wherein forming the third dielectric layer includes encapsulating exposed portions of the conductive line; and
- forming a second metal layer on the third dielectric layer, wherein the second metal layer is electrically coupled to the first metal layer and extends from the first exposed portion of the first metal layer, over the third dielectric layer, and to the second exposed portion of the first metal layer.

7. The method of claim 6, further comprising:
- removing a portion of the second metal layer to expose a portion of the third dielectric layer adjacent to the conductive line;
- forming a fourth dielectric layer on the second metal layer and on the portion of the third dielectric layer adjacent to the conductive line;
- forming an opening extending through the fourth dielectric layer and through the portion of the third dielectric layer adjacent to the conductive line; and
- forming an electrical contact at least partially within the opening extending through the fourth dielectric layer and through the portion of the third dielectric layer adjacent to the conductive line; wherein the electrical contact and the conductive line are electrically coupled.

8. The method of claim 6, further comprising electrically coupling the first metal layer to a ground connection.

9. The method of claim 6, further comprising electrically coupling the second metal layer to a ground connection.

10. The method of claim 6 wherein a first redistribution structure comprises the first metal layer and the second metal layer, the method further comprising forming a second redistribution structure.

11. The method of claim 6, further comprising forming a contact, wherein the contact is electrically coupled to the conductive line.

12. The method of claim 11 wherein the contact includes an external contact site, and wherein forming the contact includes completing an electrical path from the bond site to the external contact site.

13. The method of claim 6 wherein forming the conductive line includes filling the opening extending through the first dielectric layer and the second dielectric layer.

14. The method of claim 6 wherein forming the first metal layer includes forming the first metal layer across the entire microfeature die.

15. The method of claim 6 wherein forming the third dielectric layer includes forming a portion of the third dielectric layer to have an inverted, U-shaped cross-section that encapsulates the conductive line and contacts the section of the second dielectric layer.

* * * * *